US007212424B2

(12) United States Patent
Johnson et al.

(10) Patent No.: US 7,212,424 B2
(45) Date of Patent: May 1, 2007

(54) DOUBLE-HIGH DIMM WITH DUAL REGISTERS AND RELATED METHODS

(75) Inventors: Brian M. Johnson, Allen, TX (US); John Nerl, Londonderry, NH (US); Ronald J. Bellomlo, Woburn, MA (US); Michael C. Day, Allen, TX (US); Vicki L. Smith, NW Province (CM); Richard A. Schumacher, Dallas, TX (US); Rajakrishnan Radjassamy, Plano, TX (US); June E. Goodwin, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/085,693

(22) Filed: Mar. 21, 2005

(65) Prior Publication Data

US 2006/0209613 A1 Sep. 21, 2006

(51) Int. Cl.
*G11C 5/06* (2006.01)

(52) U.S. Cl. .................. 365/63; 365/230.08; 361/764; 716/15

(58) Field of Classification Search .................. 365/63, 365/189.12, 230.03, 240, 230.01, 230.08; 716/12, 13, 14, 15; 361/748, 760, 761, 764
See application file for complete search history.

(56) References Cited

U.S. PATENT DOCUMENTS 5,686,730 A * 11/1997 Laudon et al. ................ 365/52
6,751,113 B2 6/2004 Bhakta et al.
6,807,650 B2 10/2004 Lamb et al.
7,023,719 B1 * 4/2006 Hung et al. .................... 365/63
2003/0090879 A1 * 5/2003 Doblar et al. ............... 361/728
2003/0223303 A1 12/2003 Lamb et al.
2004/0201405 A1 * 10/2004 Bacha et al. ................ 327/156
2004/0268161 A1 * 12/2004 Ross .......................... 713/300
2005/0018495 A1 * 1/2005 Bhakta et al. .............. 365/199
2005/0183589 A1 * 8/2005 Salmon ...................... 101/3.1
2006/0137903 A1 * 6/2006 Sprietsma et al. .......... 174/255
2006/0139983 A1 * 6/2006 Sprietsma et al. ............ 365/52

OTHER PUBLICATIONS

Philips. Sep. 28, 2004. Philips SSTU32865 Product Data Sheet Rev. 02.*

JEDEC. Nov. 2004. JEDEC JESD82-9A Standard: Definition of the SSTU32865 28-bit 1:2 Registered Buffer with Parity for DDR2 RDIMM Applications.*

(Continued)

*Primary Examiner*—Richard T. Elms
*Assistant Examiner*—Alexander Sofocleous

(57) ABSTRACT

One memory module includes a printed circuit board comprising an upper row of memory integrated circuits, a lower row of memory integrated circuits, and a first addressing register and a second addressing register, the first addressing register and a second addressing register each having at least one of address and control input routing primarily provided in a first layer, the first addressing register coupled to the upper row of memory integrated circuits and the second addressing register coupled to the lower row of memory integrated circuits.

21 Claims, 14 Drawing Sheets

OTHER PUBLICATIONS

Warner, M. Jun. 22-24, 1998. Micro-ball grid arrays: a practical chip-size packaging solution for nonvolatile memory applications. Nonvolatile Memory Technology Conference. Seventh Biennial IEEE.*

Jingan Gao et al. Mar. 15-18, 2005. Micro-BGA package reliability and optimization of reflow soldering profile. Asian Green Electronics 2005.*

Wyland, C. et al. Oct. 27-29, 2003. Signal Integrity Study of 1000 Ball Grid Array Package Construction Effects on DDR2533MHz. Electrical Performance of Electronic Packaging 2003.*

Crisp, R. Nov./Dec. 1997. Direct Rambus Technology: The New Main Memory Standard. IEEE Micro Vol. 17, Issue 6. pp. 18-28.*

* cited by examiner

DOUBLE-HIGH DIMM WITH DUAL REGISTERS AND RELATED METHODS

BACKGROUND

A memory module for a computer or computer-based device generally comprises a circuit board having dynamic random access memory (DRAM) chips and a connector that enables communication with a motherboard. To operate successfully, a memory module typically meets standard timing and interface requirements for the type of memory module intended for use in the particular computer. These requirements may be proprietary, and/or defined in design specification documents that are published by either the original initiator of the standard (e.g., INTEL or IBM) or a standards issuing body such as JEDEC (Joint Electron Device Engineering Coucil).

DRAMs used in memory modules are often identified as ×4 or ×8 DRAMs. The distinction between ×4 and ×8 is determined by different number of data outputs per DRAM, with the total amount of memory available per memory module being the same. For example, error correction code (ECC) memory modules often feature 72 data bits (64 data bits plus 8-ECC bits). Therefore, a single-rank memory module with ×4 devices uses 72/4 or 18 total DRAM chips. Memory modules featuring ×8 devices use 72/8 or nine total chips. The 72-bit unit of devices (18 or 9) is referred to as a rank. In other words, rank is a term used to refer to the set of DRAM devices that are accessed during a single memory transfer. For example, the number of devices accessed is equal to the size of the data bus divided by the device width of the DRAM. A single chip select is common for all the devices in a single rank. Memory modules may also comprise two ranks, and are sometimes referred to as high density memory modules.

To respond to consumer demand for higher capacity memory modules, manufacturers of memory modules have attempted to place a higher density of memory integrated circuits on printed circuit boards. One mechanism for achieving high memory density is through the use of micro-ball grid array (micro-BGA) designs. Micro-BGA integrated circuits use a connection technique that places the connections for the integrated circuit between the body of the integrated circuit and the surface of the printed circuit board. Stacking is another technique, whereby a second layer of integrated circuits is provided on top of the integrated circuits disposed upon the surface of the printed circuit board.

The demand for high speed, high capacity memory modules for use in the computer industry has grown rapidly, fostering the need for continued improvements in these and other memory module designs and techniques.

SUMMARY

An embodiment of a memory module comprises a printed circuit board comprising an upper row of memory integrated circuits, a lower row of memory integrated circuits, and a first addressing register and a second addressing register, the first addressing register and a second addressing register each having at least one of address and control input routing primarily provided in a first layer, the first addressing register coupled to the upper row of memory integrated circuits and the second addressing register coupled to the lower row of memory integrated circuits.

An embodiment of a method comprises communicating at least one of address and control signals between an upper row of memory integrated circuits and a first addressing register, communicating at least one of address and control signals between a lower row of memory integrated circuits and a second addressing register, and communicating at least one of address and control signals to the first addressing register and the second addressing register, the entirety of the at least one of address and control signals provided substantially on a single layer.

An embodiment of a memory module comprises means for providing at least one of address and control signals between an upper row of memory integrated circuits and a first addressing register, means for providing at least one of address and control signals between a lower row of memory integrated circuits and a second addressing register, and means for providing at least one of address and control signals to the first addressing register and the second addressing register, the entirety of the at least one of address and control signals provided substantially on a single layer.

An embodiment of a double high memory module comprises a printed circuit board configured as a micro-ball grid array, the printed circuit board comprising a first row of memory integrated circuits, a second row of memory integrated circuits, a first addressing register and a second addressing register each having at least one of address and control input routing primarily provided in a first layer, the first addressing register coupled to the first row of memory integrated circuits and the second addressing register coupled to the second row of memory integrated circuits, and a first phase-locked loop and a second phase-locked loop, the first phase-locked loop coupled to the first row of memory integrated circuits and the first addressing register, the second phase-locked loop coupled to the second row of memory integrated circuits and the second addressing register.

BRIEF DESCRIPTION OF THE DRAWINGS

The components in the drawings are not necessarily to scale, emphasis instead being placed upon clearly illustrating the principles of the disclosed systems and methods. Moreover, in the drawings, like reference numerals designate corresponding parts throughout the several views.

DETAILED DESCRIPTION

Disclosed herein are various embodiments of memory modules and methods. A double-high, dual in-line memory module (DIMM) is disclosed as one embodiment of a memory module based on a micro-ball grid array (micro-BGA) design. The phrase "double-high" generally refers to a memory module having approximately twice the height but the same number of ranks as a standard (e.g., Joint Electron Device Engineering Coucil, or JEDEC) single high DIMM. One embodiment of a memory module, as disclosed herein, comprises two SSTU32865 JEDEC compliant registers (herein SSTU registers) that implement a 2 rank×72 double-high DIMM in a non-standard manner. Such a memory module is a full 72 bits wide without requiring the use of stacking technology.

Figure 1:
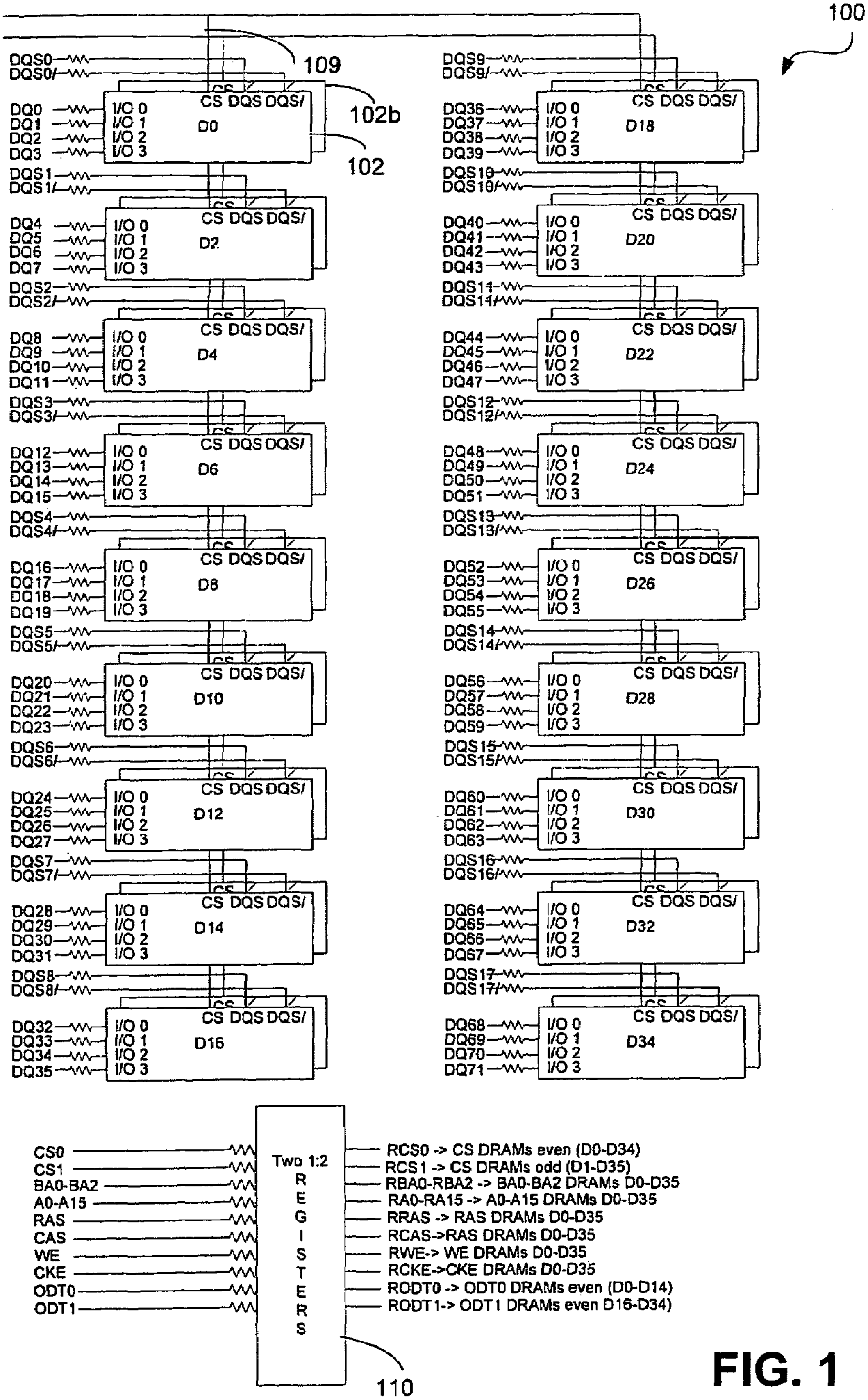
FIG. 1 is a schematic diagram of an embodiment a memory module.

In the description that follows, an exemplary double-high DIMM is described in association with FIG. 1, followed by description of data and control signal distribution, bus topologies, and layer utilization corresponding to FIGS. 2–10. FIGS. 11A–12B provide an illustration of exemplary PLL and register connectivity.

FIG. 1 is a schematic diagram of an embodiment a memory module 100 comprising a plurality of integrated circuits (e.g., dynamic random access memory, or DRAM). In particular, the memory module 100 includes ×4 DRAMs 102 of a first rank corresponding, for example, to a top-side surface of a printed circuit board. DRAMs 102*b* shown partially obscured from view in FIG. 1 correspond to a second rank located, for example, on a back surface of the printed circuit board. In other words, all the DRAMs 102 on one top-side surface are part of a single rank. The rest of the DRAMs 102*b* on the back-side surface of the board are a second rank. Any pair of DRAMs 102 and 102*b* drive the same set of data lines, and since they are members of opposite located ranks, they drive/receive on the data lines at opposite or non-overlapping times. Each of the DRAMs 102 (labeled D0–D34, and the partially obscured DRAMs 102*b* may be labeled D1–D35) share a set of data lines (labeled DQ) and a set of strobe lines (labeled DQS and DQS/ (or equivalently, DQS_L)), the DQS and DQS/ representing two halves of a differential pair associated with the strobe lines). The DRAMs 102 that drive the data line are selected based on the chip select (CS) inputs, such as carried on CS line 109. Also included are two standard 22 bit-wide, 1:2 SSTU registers (one shown, collectively designated in FIG. 1 as SSTU registers 110) with parity detection. The SSTU registers 110 are coupled to the DRAMs 102 via pre-register address and control lines (see FIG. 2, symbolically represented by arrows 220 and 222) and post-register address and control lines (see FIG. 2, symbolically represented by arrows 208, 210, 212, and 214).

By increasing the number of inputs that each signal to be fanned out touches, there is an effective increase in the total number of outputs that the original signal is capable of being broadcast to effectively. In particular, each address/control signal of the memory module 100 drops to two inputs of the 1:2 fanout buffers (not shown) included within the SSTU registers 110, creating a total of four outputs available to drive the group of signals of interest. For example, with a total of 36 DRAM loads, each output drives an average of 9 loads, consuming approximately twice the number of 1:2 channels that are used in a typical SSTU register application.

Figure 2:
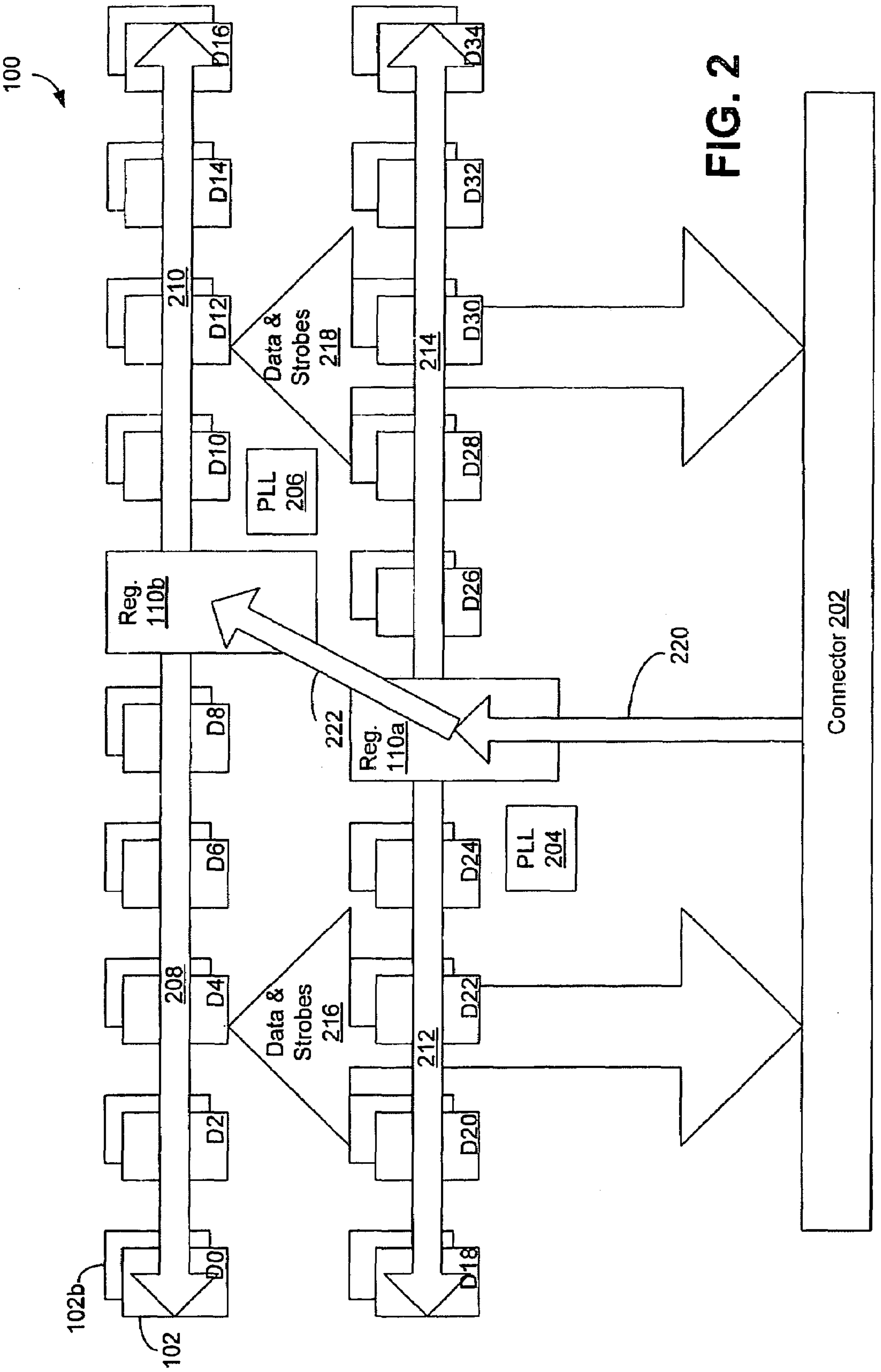
FIG. 2 is a schematic diagram that symbolically illustrates how control and data signals are distributed across the memory module of FIG. 1.

FIG. 2 is a schematic diagram that symbolically illustrates how control and data signals are distributed across the memory module 100. The memory module 100 is shown in a plan view, with a top rank of DRAMs 102 and a bottom rank of DRAMs 102*b*. The memory module 100 also includes a connector 202, bottom row and top row phase-locked loops (PLLs) 204 and 206, respectively, and bottom row and top row registers 110*a* and 110*b*, respectively. Viewing the top and bottom ranks in the schematic on the top left-hand side of FIG. 2, shown are 10 DRAMs 102 (i.e., 5-DRAMs 102 and 5-DRAMs 102*b*). Similarly, on the top right-hand side of the schematic, 8 DRAMs 102 are shown. The bottom left-hand side of the schematic reveals 8 DRAMs 102 and the bottom right-hand side of the schematic shows 10 DRAMs 102. In one embodiment, the PLLs 204 and 206 are configured as industry standard CU877 PLLs, with 10 clock outputs per PLL. Each PLL output connects to two DRAMs 102.

The bulk arrows 208–222 symbolically represent signal (e.g., data, address, and/or control) flow through the various component of the memory module 100. In particular, bulk arrows 208–214 symbolically represent address and control signal flow along address and control buses from the registers 110*a* and 110*b* to the DRAMs 102. Bulk arrows 216 and 218 symbolically represent data and strobe signals between the connector 202 and the DRAMs 102. Bulk arrow 220 symbolically represents address and control signals along an address and control line(s) from the connector 202 to the bottom register 110*a*, and bulk arrow 222 symbolically represents the continuation of the address and control signals along an address and control line(s) to the top register 110*b*. Although not shown, but similar in manner to the address and control signals 220 and 222, routing for the PLLs 204 and 206 occurs to the center of the memory module 100, and then splits there and routes to both of the PLLs 204 and 206.

Figure 3:
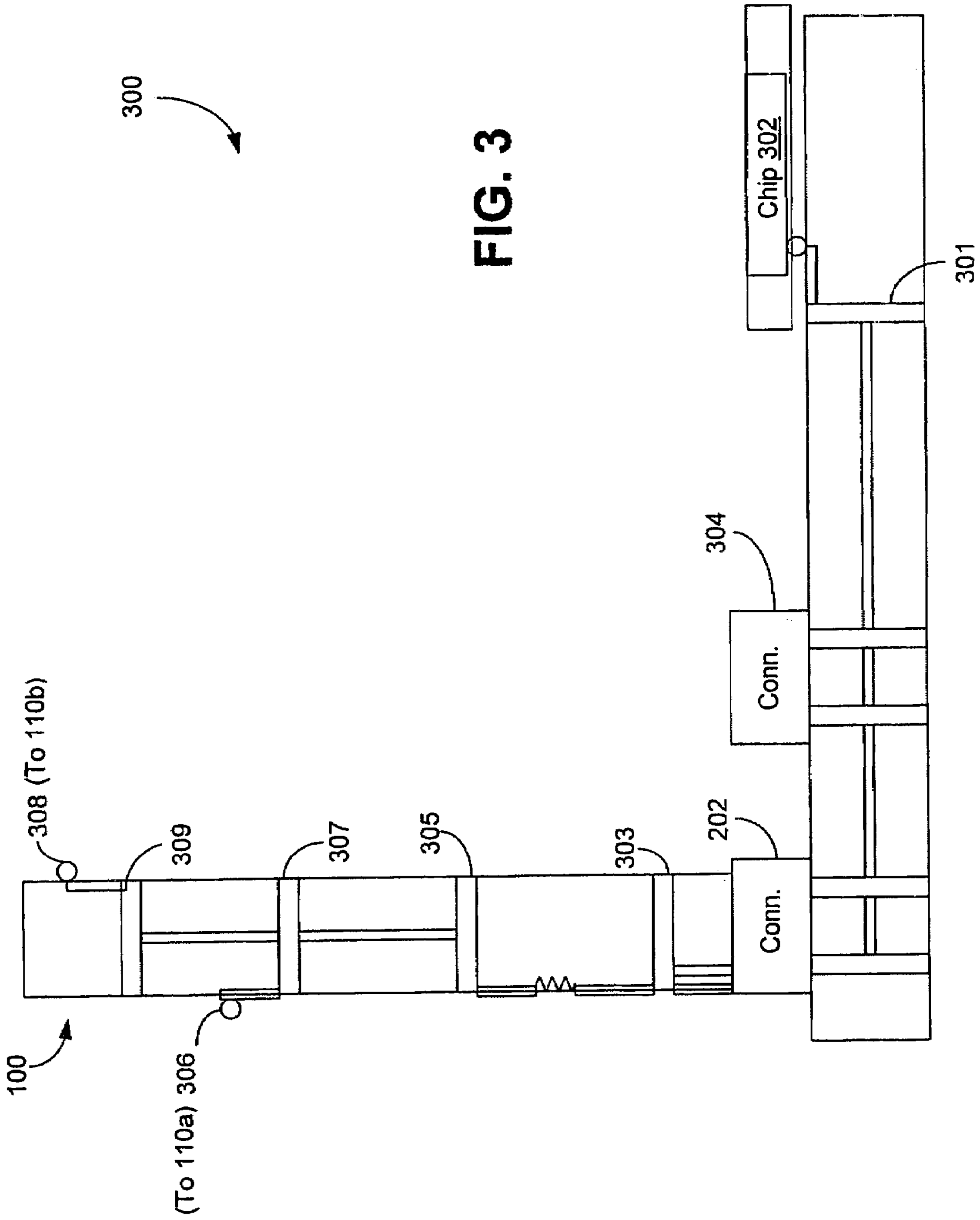
FIG. 3 is a schematic diagram that illustrates an exemplary registered address and control bus topology for the memory module of FIG. 1.

FIG. 3 is a schematic diagram that illustrates an exemplary registered address and control bus topology 300 for the memory module 100. In general, address or control signals derived from a motherboard chip 302 travel through a first via 301 and along a predetermined net length to the memory module connector 304, and from the connector 304 over a medium of a predetermined net length to connector 202 of the memory module 100. From the connector 202, the signal travels a predetermined net length, passing through vias 303, 305, and 307, and then dropped at the first register 110*a* (FIG. 2) at location 306 (corresponding to lower register 110*a*, FIG. 2). The signal then passes another predetermined net length, through via 309, and is dropped at the second register 110*b* (FIG. 2) at location 308 (corresponding to upper register 110*b*, FIG. 2). Some exemplary distances between the connector 202 and the first register 110*a* include, by way of example and not limitation, approximately 1543–1843 mils, and from the connector 202 to the second register 110*b* approximately 2990–3190 mils.

Figure 4:
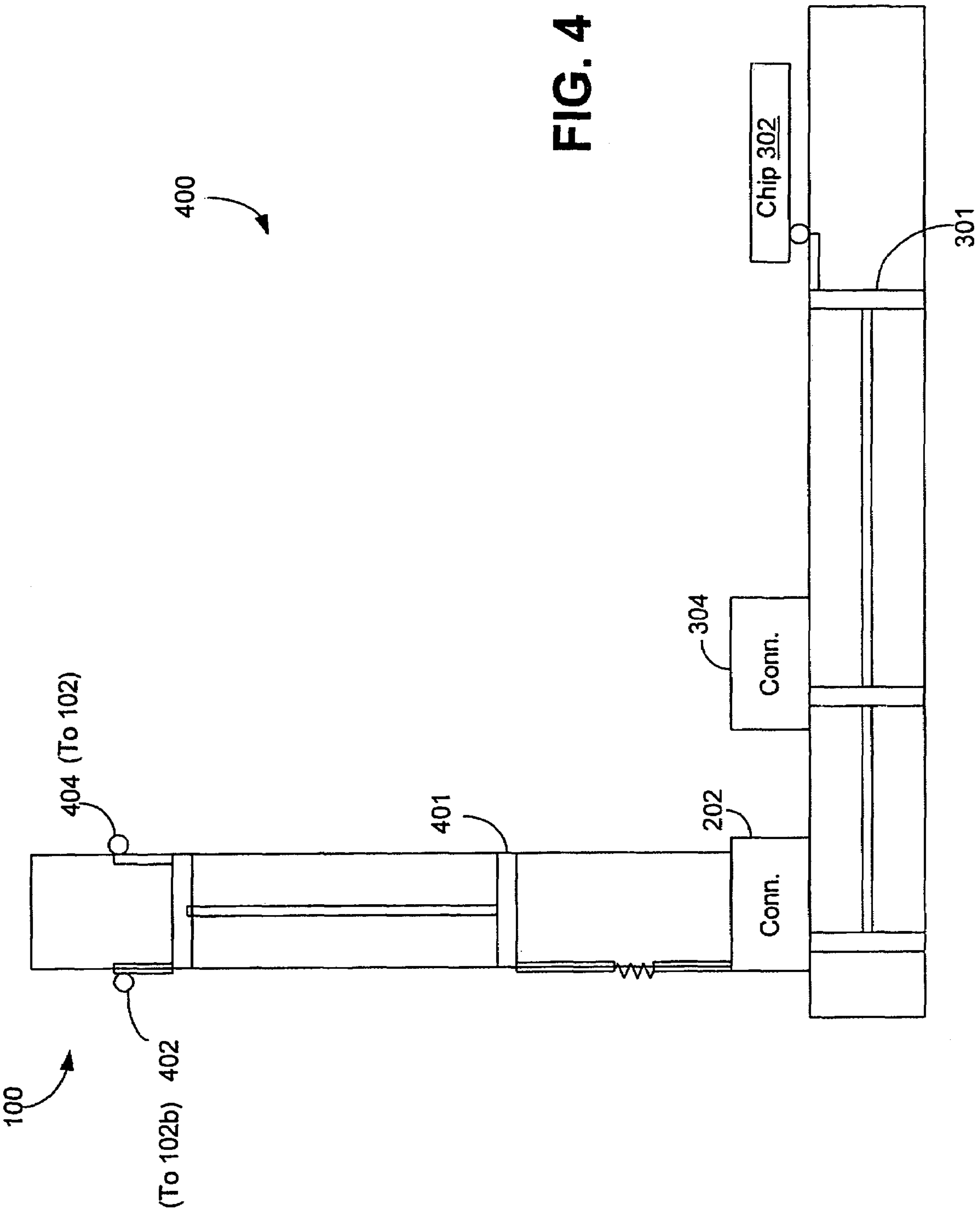
FIG. 4 is a schematic diagram that illustrates an exemplary dynamic random access memory (DRAM) bus topology for the memory module of FIG. 1.

FIG. 4 is a schematic diagram that illustrates an exemplary DRAM bus topology 400 for the memory module 100. A data signal derived from the motherboard chip 302 travels to the memory module connector 304 through a via 301 along a predetermined net length, and then another predetermined net length from the connector 304 to the memory module connector 202. From the connector 202, the signal travels through via 401 along a predetermined net length to DRAM 102*b* (FIG. 2) at location 402 and a corresponding paired DRAM 102 (FIG. 2) at location 404. Exemplary lengths from the connector 202 to the DRAM 102*b* is approximately 1496–1596 mils, and from the connector 202 to the DRAM 102 is between 2114–2214 mils. Note that these dimensions are provided by way of example, and are not intended to be limiting.

Figure 5:
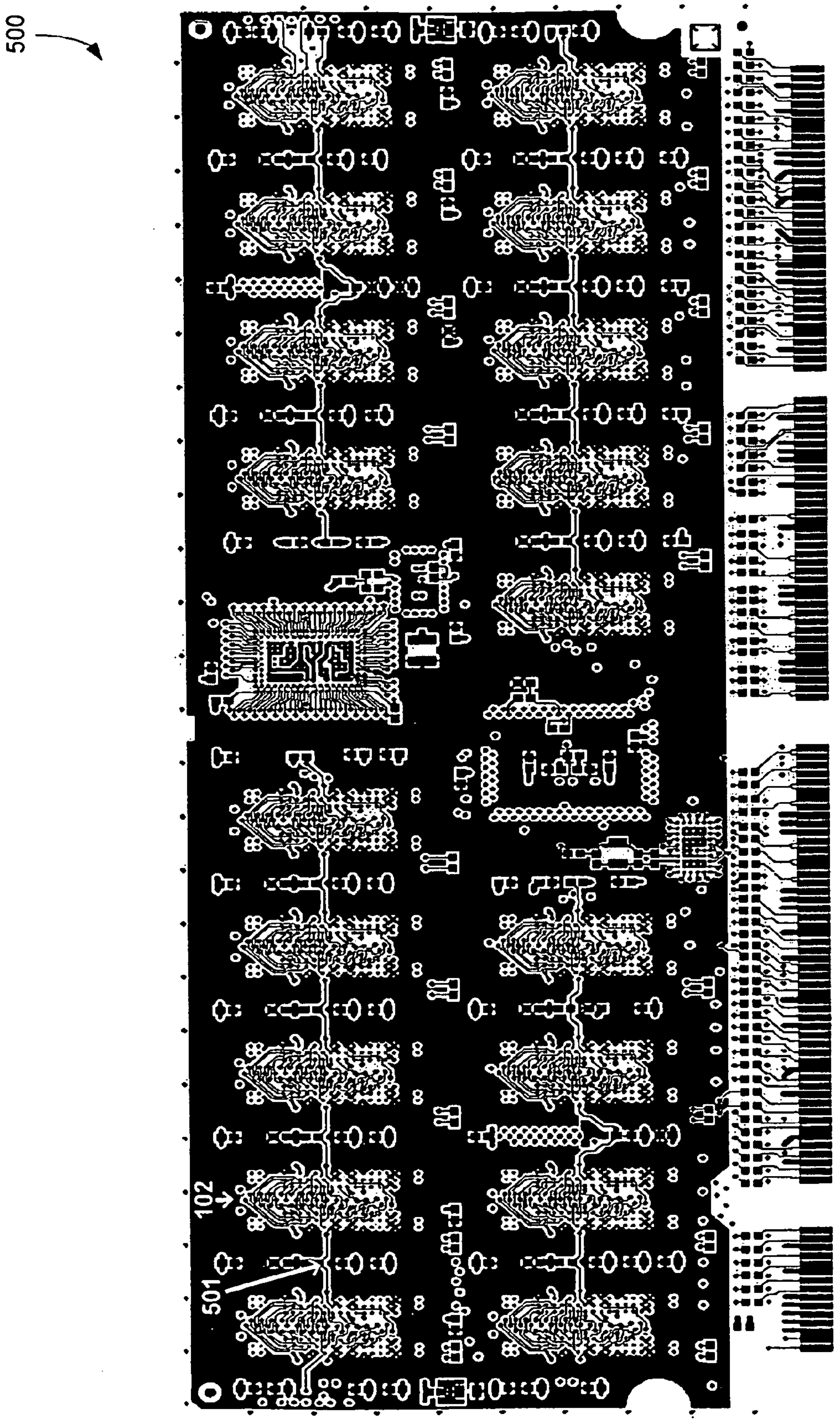
FIGS. 5–10 include artwork of various layers of the memory module of FIG. 1.

FIGS. 5–10 are schematic diagrams that illustrate various layers of the memory module 100. In other words, a layer utilization is shown in FIGS. 5–10, which illustrate one routing embodiment in the "stack-up" of the memory module 100 in a micro-BGA design. Some layers, such as ground or power are not shown, as one skilled in the art would understand that various configurations for these intermediate layers may be used. FIG. 5 shows a surface level, S1 500, which includes package escape routing that provides for common routing to reach a via to distribute signals to another level. As shown, an exemplary Vref distribution is represented by each triangular region 501 located midway between DRAMs 102, which indicate relatively thin traces rather than a flooding as in traditional systems. In one embodiment, it is a more efficient use of available area to flood the top and bottom surfaces with power supply voltage V1_8 than to flood the surfaces with VREF.

Figure 6:
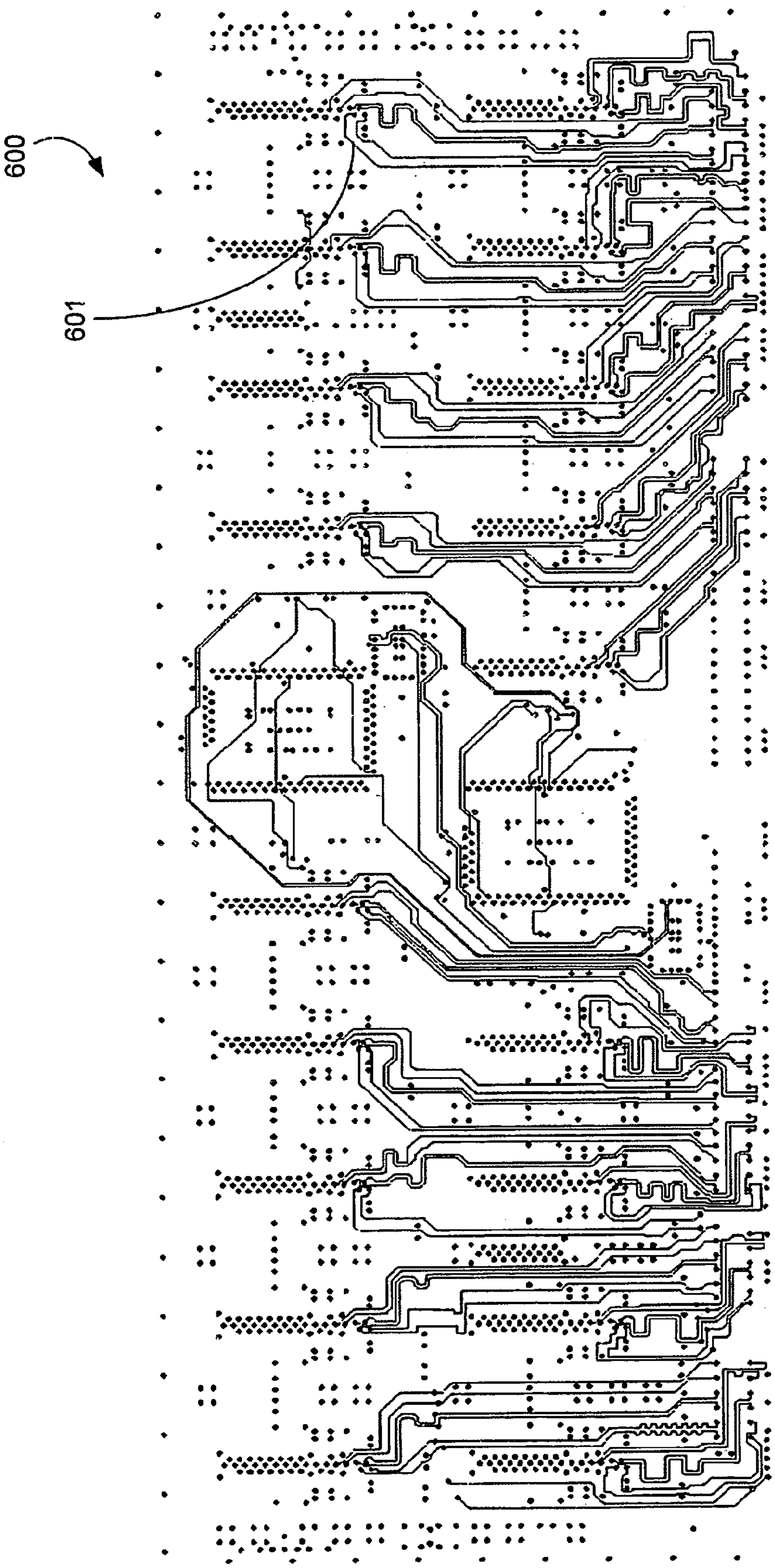

FIG. 6 illustrates the data and strobe routing 601 on layer S2 600. The routing shown here enables an efficient distribution of Vref, in addition to the generation of Vref on the memory module 100. Typically, Vref is passed via a pin onto a conventional DIMM, generated from a converter or divider on a motherboard. The memory module 100 generates Vref, which enables close tracking of VDD/2. In one embodiment, Vref is generated using a set of resistive dividers (e.g., one at each end of the board).

Figure 7:
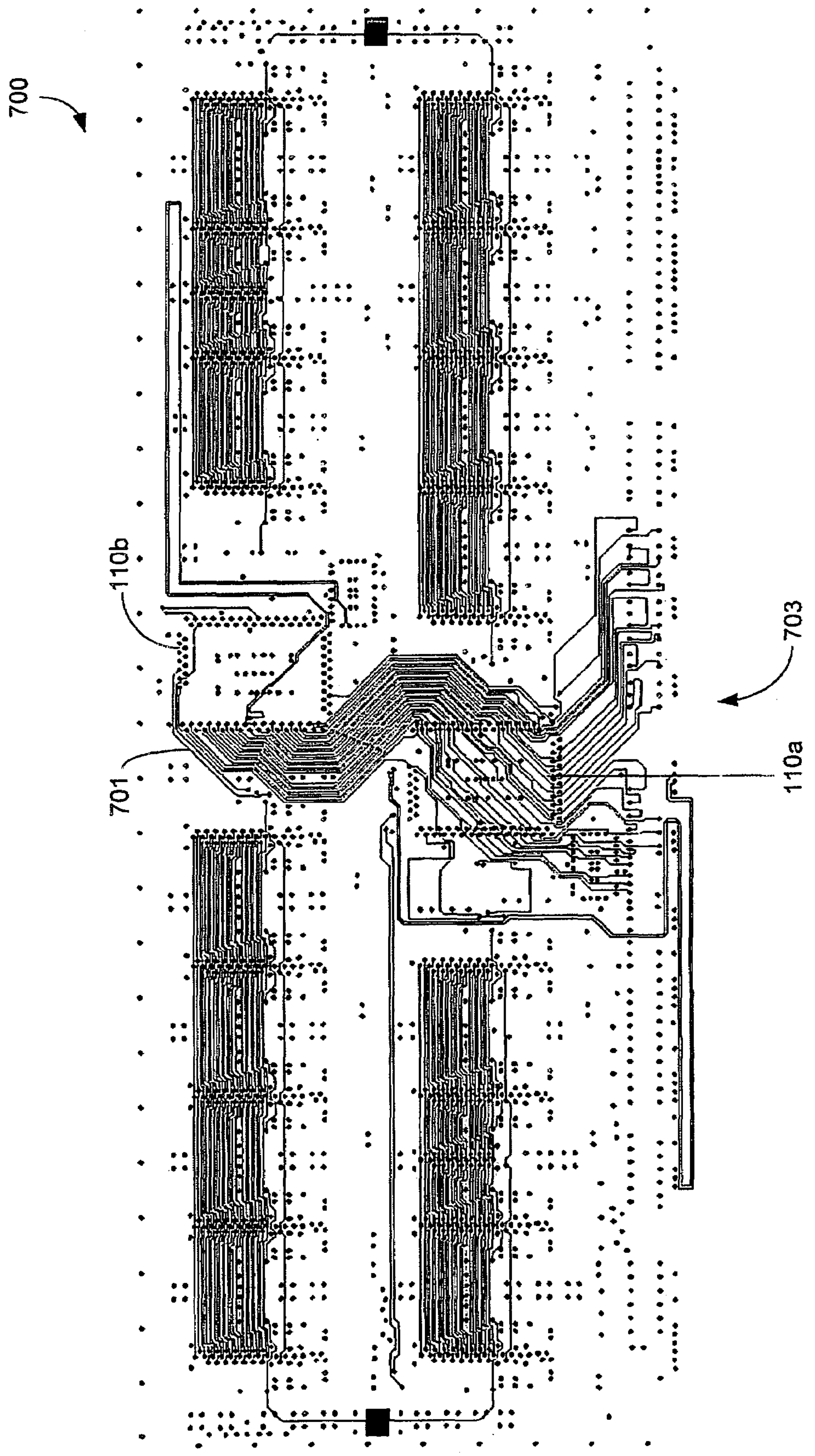

FIG. 7 illustrates the address and control line distribution routing 701 to the registers 110*a* and 110*b*, the routing 701 all on a single layer S3 700. As shown by the routing 701, the address and control lines come in and drop to the two SSTU registers 110*a*, 110*b*, and then there is the horizontal fan-out of the address and control lines. In particular, the center region 703 represents routing 701 coming up from the connector 202 (FIG. 2) and dropping at the input pins of the bottom row SSTU register 110*a* and then the upper row SSTU register 110*b*. Distributing to the SSTU registers 110*a*, 110*b* primarily in a single layer 700 obviates the need for a via, which can detract from the signal integrity of the memory module 100 (FIG. 2). Such a distribution also saves a layer in the design, enabling implementation of a double high design in the specified number of layers without resorting to technologies such as blind or buried via methods. Routing between layers S2 600 and S3 700 can be orthogonal to avoid coupling interference between the same lines located on adjacent layers.

Figure 8:
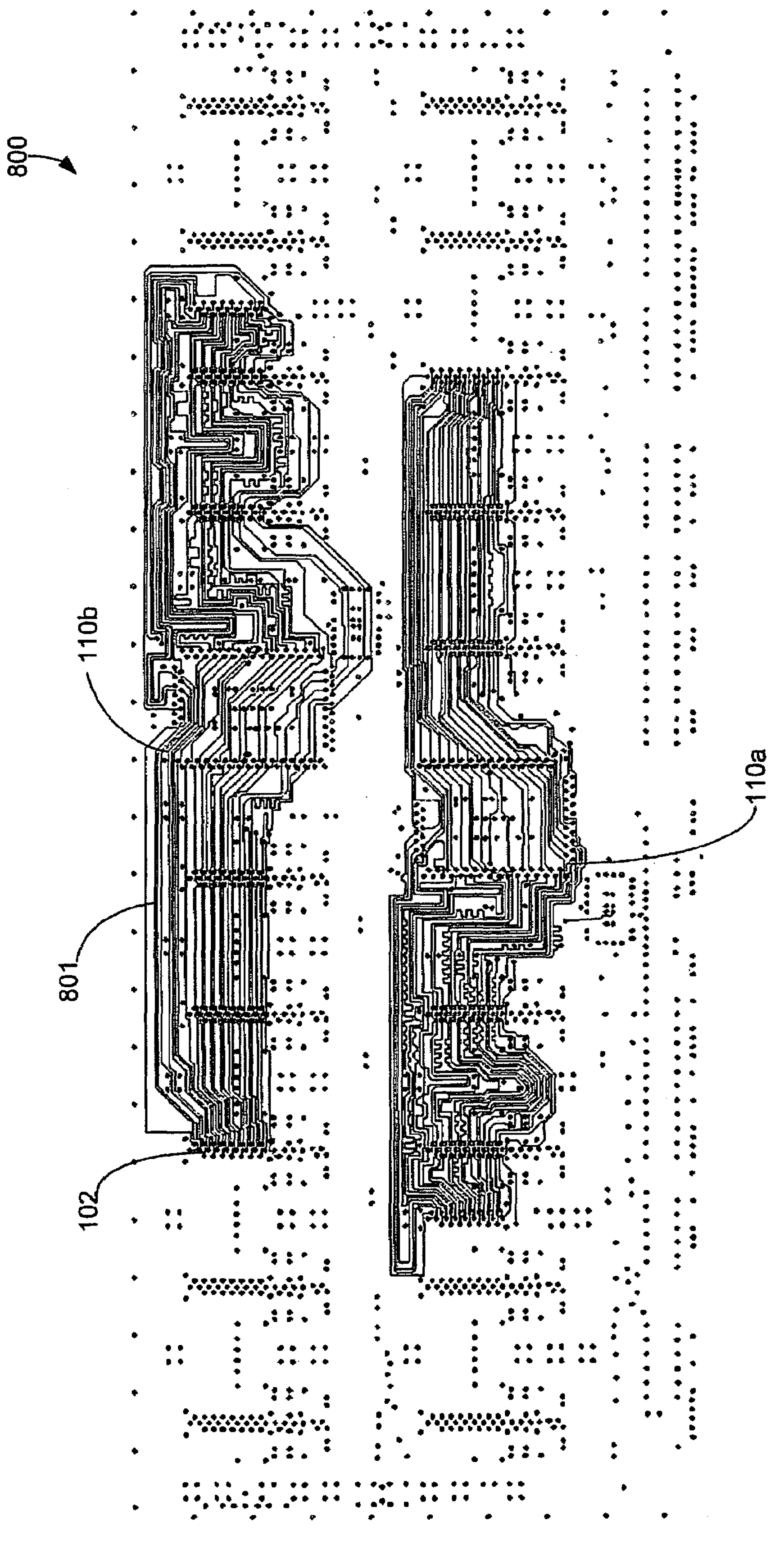

FIG. 8 illustrates routing 801 for layer S4 800, and in particular, shows the distribution from the SSTU registers 110*a*, 110*b* to the DRAMs 102.

Figure 9:
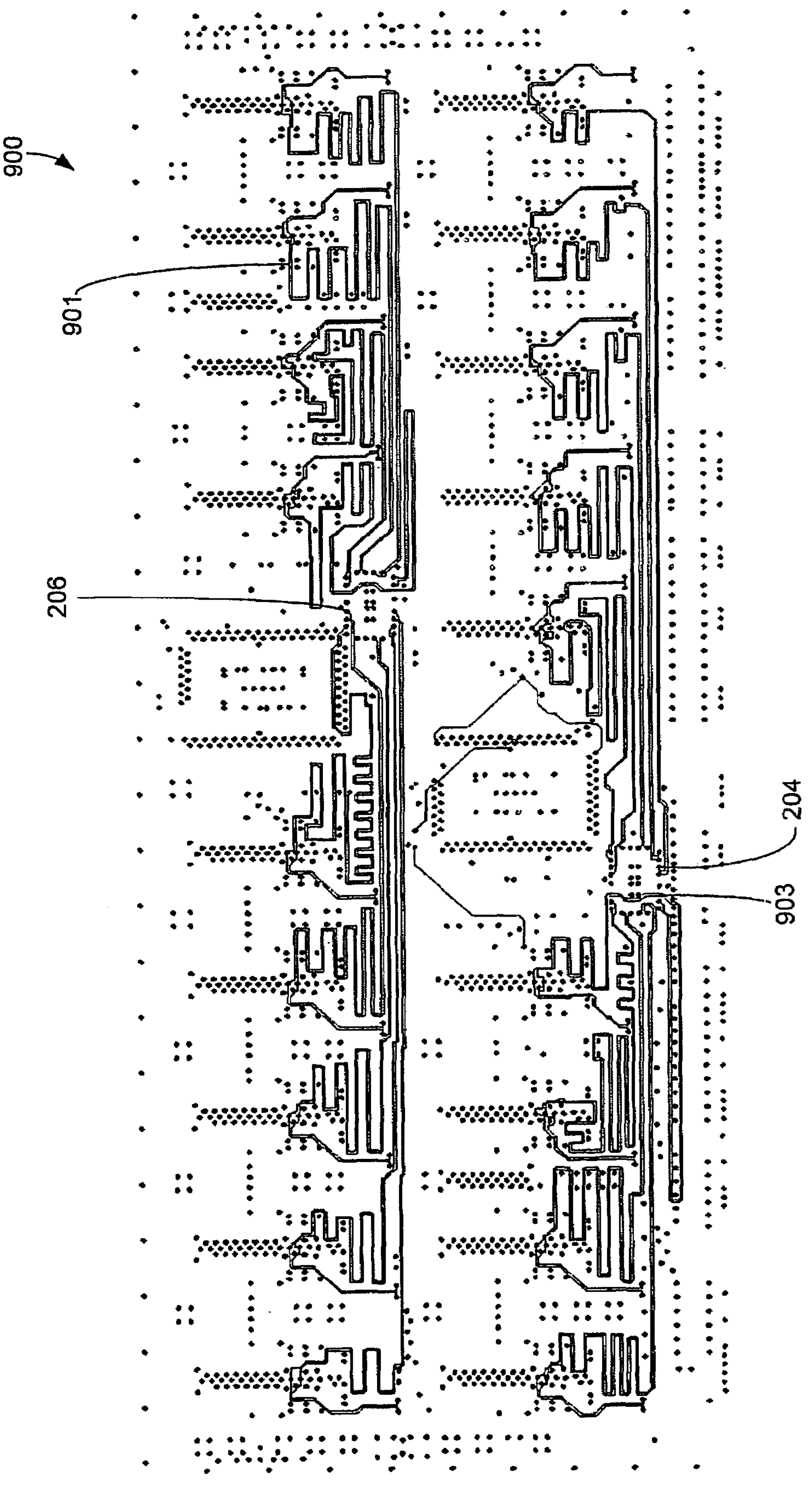

FIG. 9 illustrates PLL clock distribution routing 901 for layer S5 900, with a bottom row PLL 204 and an upper row PLL 206. In this layer S5 900, two industry standard PLLs 204 and 206 are used while still only using a single clock to enter the memory module 100 (FIG. 2). The input routing 901 are not on a single layer, since a tee configuration of a differential pair is provided (otherwise, crossing of the lines would occur), as described below. Because the PLLs 204 and 206 are not cascaded, but rather configured in parallel, any jitter of the two PLLs 204 and 206 doesn't add or increase because of the use of two PLLs 204 and 206. Additionally, because the top register 10*b* and top DRAMs 102 are all on a single PLL output, there is no timing cost to having the two PLLs 204 and 206 because the memory module 100 operates in two entirely separate clock domains (top row and bottom row). With this configuration, no post-register signals or data lines cross the two separate clock domains and as a result, if the clock is a little early from one PLL and a little late from another PLL, this is not any more problematic than it would be with a single PLL as they are in separate clock domains and consequently their individual jitter characteristics do not contribute in an additive fashion to the timing constraints of the system.

Figure 10:
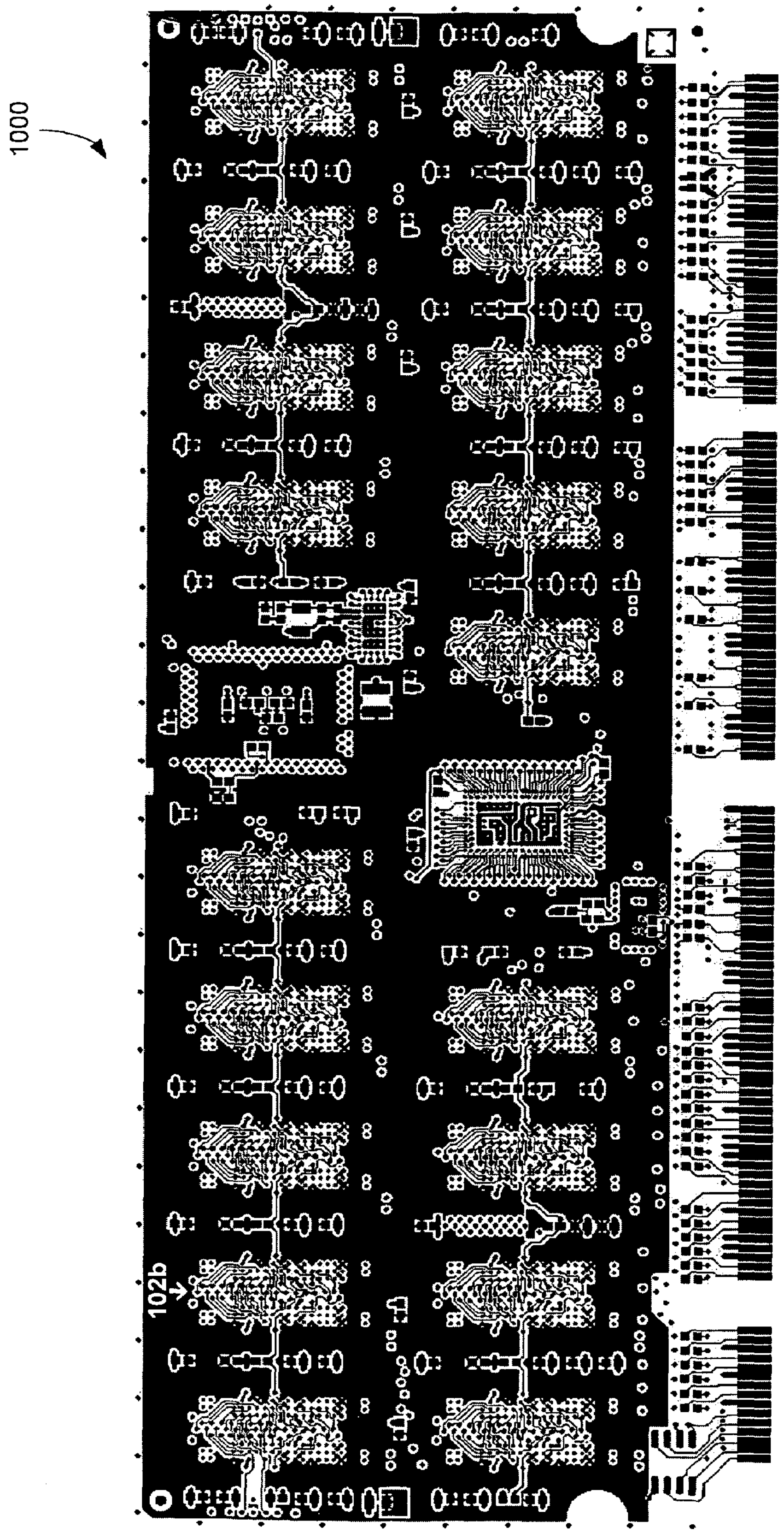

FIG. 10 is an illustration of layer S6 1000, which provides for escape package routing and Vref distribution. Shown are DRAMs 102*b*.

Figures 11A, 11B, 11C:
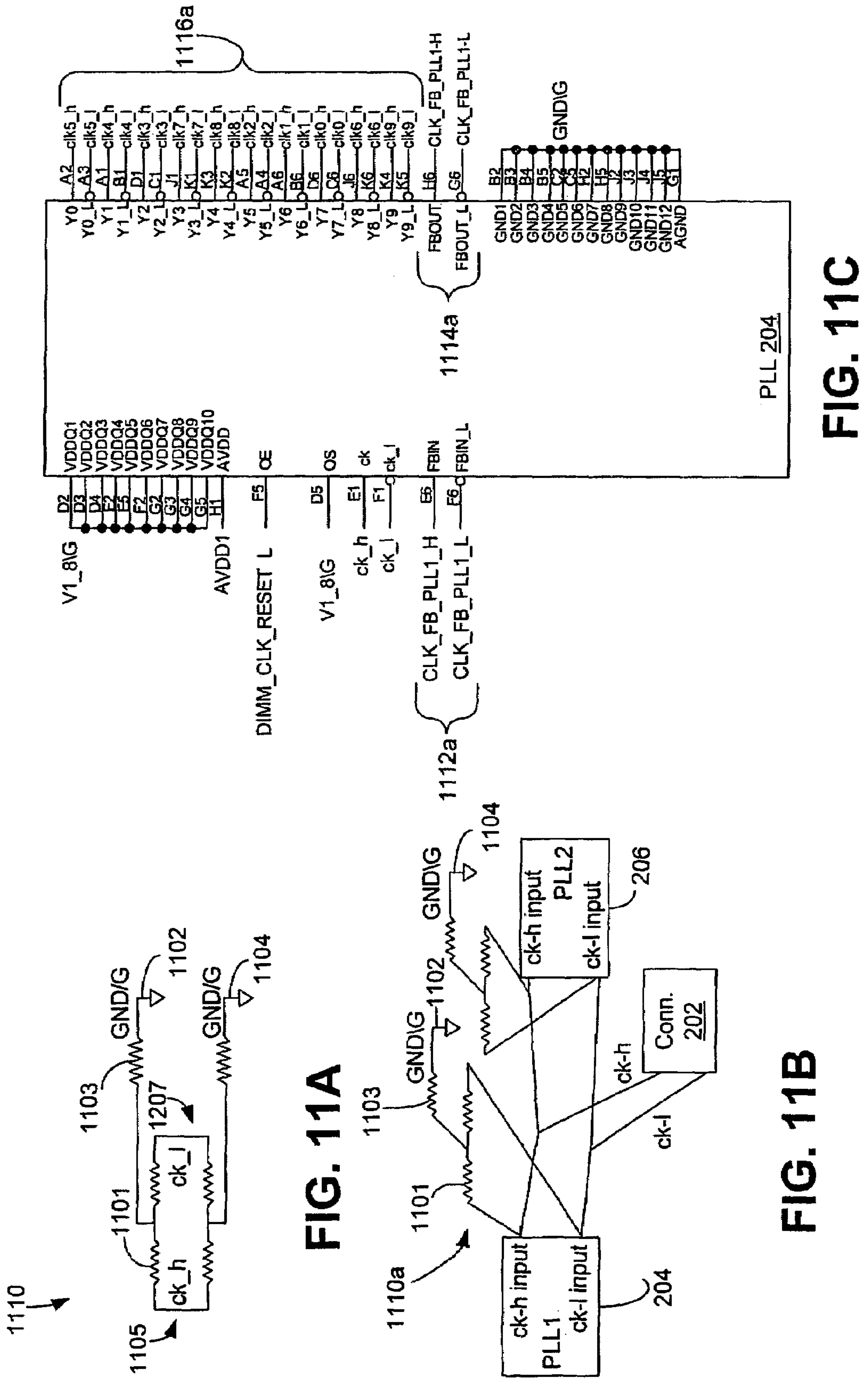
FIGS. 11A–11D are schematic diagrams showing exemplary connectivity at the phase-locked loops (PLLs) of the memory module of FIG. 1.

FIGS. 11A–11D are schematic diagrams showing exemplary connectivity at the PLLs 204 and 206. FIG. 11A includes a divider network 110 comprising resistors 1101 and 1103, clock signals clk_h 1105 and clk-l 1107, and grounded input and output terminals 1102 and 1104 (labeled GND/544 G), respectively. FIG. 11B illustrates an embodiment 1110*a* of the divider network 1110 shown in FIG. 11A, which provides a higher level perspective of the divider network connectivity. As shown, the divider network 1110*a* is an external circuit designed to terminate in a workable fashion the single clock coming into the connector 202 of the memory module 100, while still allowing it to be distributed to the two separate PLLs (PLL1, 204, and PLL2, 206). The clock differential pair signals enter the connector 202, travel a predefined length as clk_l and clk_h, and then split to the PLLs 204 and 206 as shown. At the inputs of each of the PLLs 204 and 206 (inputs labeled ck_h input, ck_l input), there are three external resistors (1101 and 1103). In one embodiment, these resistors 1101 and 1103 are connected in a Y-pattern where two ends of the Y are connected to resistors 1101 and 1103 and then the third end of the Y is connected to ground (GND/G) 1102 and 1104. The Y-circuit provided a termination needed at the PLL inputs while still allowing the signal to transition in a way that will be properly interpreted as a clock edge at the PLL input.

Figure 11D:
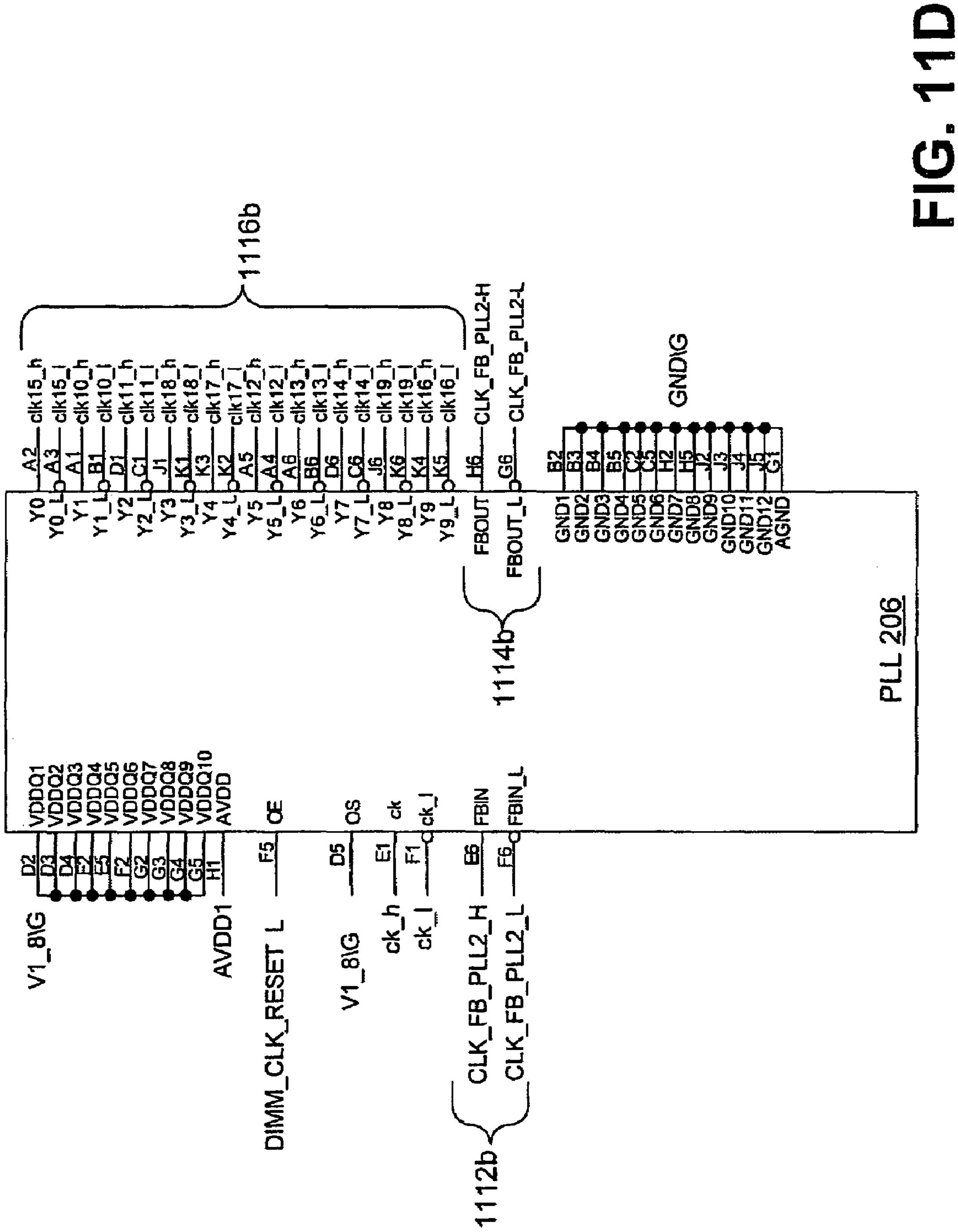

FIGS. 11C and 11D illustrate exemplary PLL pinouts. As shown in both figures, two industry standard CU877 PLLs (204 and 206) are utilized, the upper PLL 206 (FIG. 2) feeding the upper half of the memory module 100 (FIG. 2) and the lower PLL 204 feeding the bottom half of the memory module 100. Differences in connections between PLL 204 and PLL 206 are found at pinouts 1112*a*, 1114*a*, and 1116*a* (as compared to like connections 1112*b*, 1114*b*, and 1116*b* in FIG. 11D). pinouts 1112*a* and 1114*a* correspond to terminals for input and output feedback clock signals, respectively, that the PLL 204 uses to enable tuning of the output clock phase relative to the input clock phase. pinouts 1116*a* correspond to clock outputs to the DRAMs and the registers.

FIG. 11D shows the pinout connections for the PLL 206, which are arranged similarly to the PLL 204 except that pinout groups 1112*b*, 1114*b*, and 1116*b* correspond to like-function pinouts described for the PLL 204 of FIG. 12C as they pertain to the PLL 206. The operation of register 206 is similar to that described for PLL 204, and thus discussion of the same is omitted.

Figure 12A:
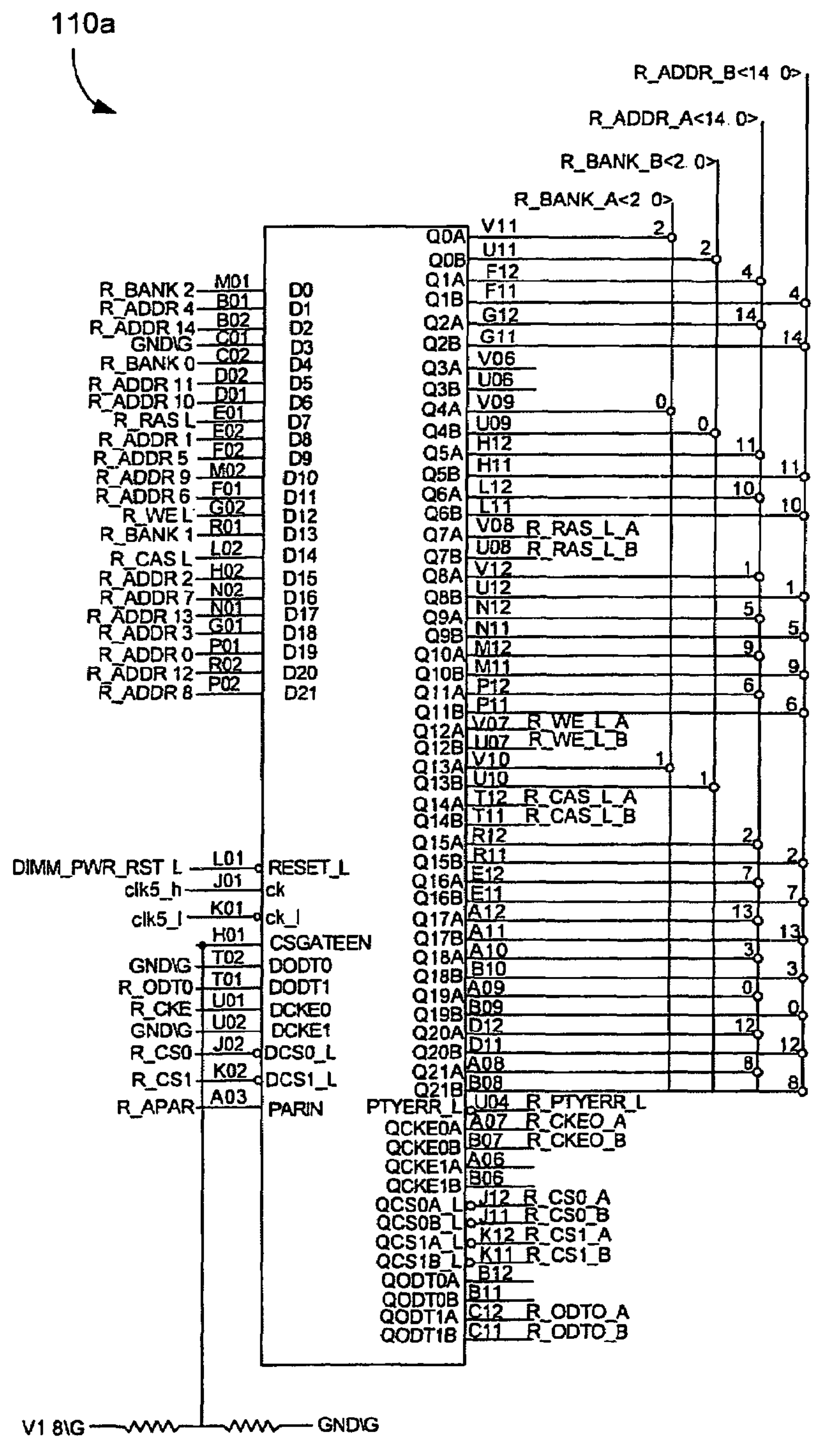
FIGS. 12A–12B are schematic diagrams showing exemplary connectivity at SSTU registers of the memory module of FIG. 1.
Figure 12B:
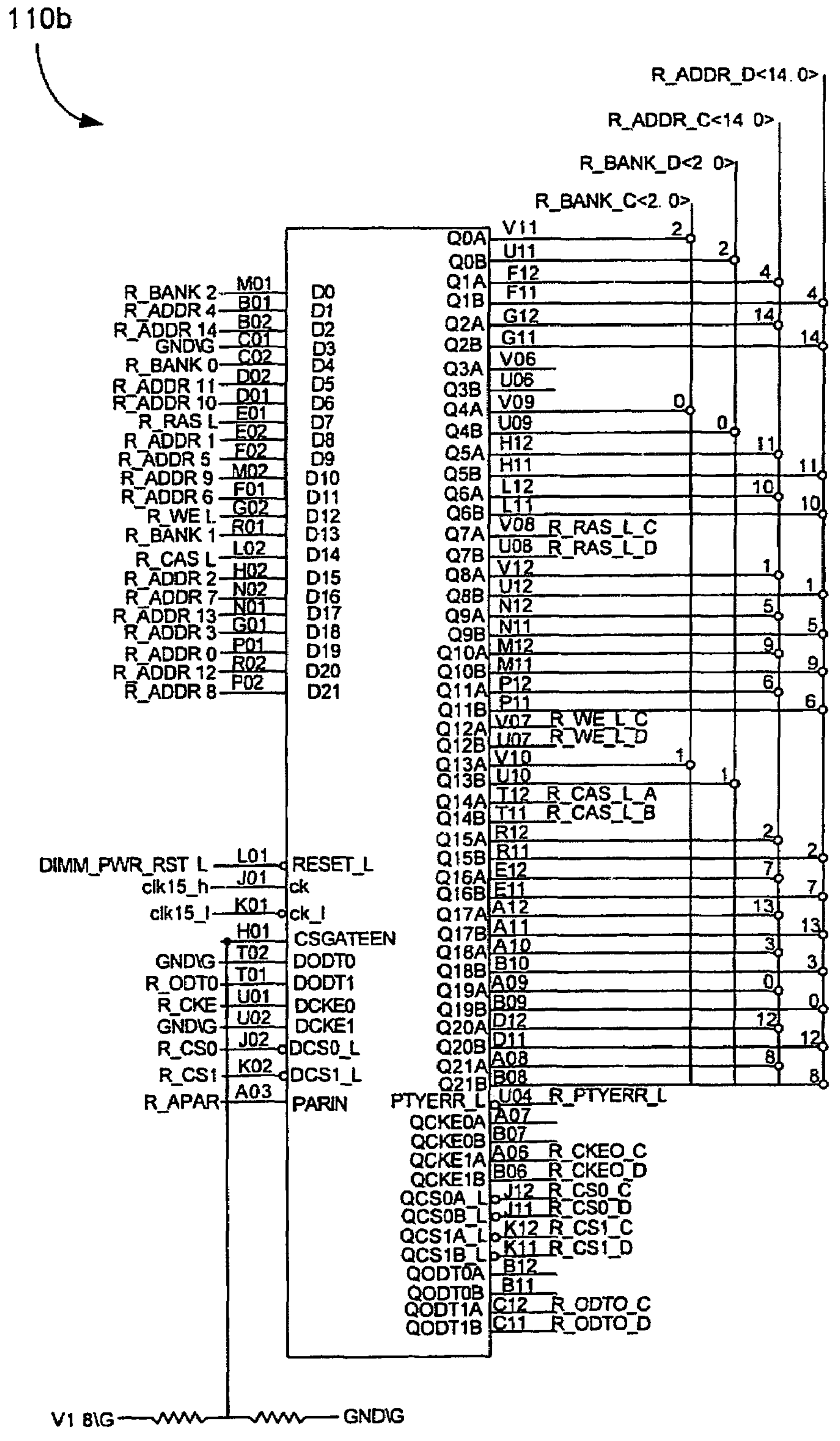

FIGS. 12A–12B are schematic diagrams that show exemplary connectivity at the SSTU registers 110*a* and 110*b*. The pinout connectivity, partially shown in FIGS. 12A–12D, enables the bulk routing (e.g., routing or tracing carrying data, control, and/or address signals minus the escape routing) of the routing to both SSTU registers 110*a* and 110*b* to occur in a single layer. The pin-out of the SSTU registers 110*a*, 110*b* are re-organized, yet compatible with JEDEC. As shown in FIGS. 12A-12B, each SSTU register 110*a*, 110*b* has two chip select inputs provided at R_CSO and R_CS1 terminals. These chip select inputs each connect to both registers 110*a* and 110*b*. Since each register receives the same set of chip select signals, both registers are active for the same set of transactions. If either R_CS0 or R_CS1 is asserted, then both registers act in the same fashion, calculating parity and propagating address and control to the DRAMs connected to their respective address and control outputs. If either register determines that a parity error has occurred, the module asserts a signal to indicate this error. The logical OR'ing of the parity error signal from the two registers is accomplished using an open-drain output from each of the registers connected to a signal that is by default pulled high using a pull-up resistor.

What is claimed is:

1. A memory module, comprising:

a printed circuit board comprising an upper row of memory integrated circuits, a lower row of memory integrated circuits, and a first addressing register and a second addressing register, the first addressing register and the second addressing register each having at least one of address and control input routing primarily provided in a first layer, the first addressing register coupled to the upper row of memory integrated circuits and the second addressing register coupled to the lower row of memory integrated circuits.

2. The memory module of claim 1, further comprising a first phase-locked loop coupled to the upper row of memory integrated circuits and a second phase-locked loop coupled to the lower row of memory integrated circuits.

3. The memory module of claim 2, further comprising an escape routing provided between a surface layer and the first addressing register and the second addressing register.

4. The memory module of claim 1, further comprising a first phase-locked loop in a parallel configuration with respect to a second phase-locked loop, the first phase-locked loop coupled to the upper row of memory integrated circuits and the second phase-locked loop coupled to the lower row of memory integrated circuits.

5. The memory module of claim 1, further comprising a voltage reference circuit disposed on the memory module and distributed between each memory integrated circuit of the upper memory integrated circuits and between each memory integrated circuit of the lower memory integrated circuits.

6. The memory module of claim 1, wherein the upper memory integrated circuits and the lower memory integrated circuits collectively comprise a 72-bit wide capacity.

7. The memory module of claim 1, wherein each of the upper memory integrated circuits and the lower memory integrated circuits comprise a ×4 dynamic random access memory.

8. The memory module of claim 1, wherein the printed circuit board is configured as a micro-ball grid array.

9. A method for operating a memory module, comprising:

communicating at least one of address and control signals between an upper row of memory integrated circuits and a first addressing register;

communicating at least one of address and control signals between a lower row of memory integrated circuits and a second addressing register; and communicating at least one of address and control signals to the first addressing register and the second addressing register, the entirety of the at least one of address and control signals provided substantially on a single layer.

10. The method of claim 9, further comprising splitting an input clock signal into a plurality of clock signals.

11. The method of claim 9, further comprising communicating a plurality of clock signals to a plurality of phase-locked loops disposed on the memory module from a single inputted clock signal.

12. The method of claim 9, further comprising deriving a voltage reference signal within the memory module.

13. The method of claim 9, further comprising providing a 72-bit wide data output.

14. A memory module, comprising:

means for providing at least one of address and control signals between an upper row of memory integrated circuits and a first addressing register;

means for providing at least one of address and control signals between a lower row of memory integrated circuits and a second addressing register; and means for providing at least one of, address, and control signals to the first addressing register and the second addressing register, the at least one of address and control signals provided substantially on a single layer.

15. The memory module of claim 14, further comprising means for providing two clock signals to two phase-locked loops disposed on the memory module based on a single inputted clock signal.

16. The memory module of claim 15, wherein the means for providing two clock signals comprises at least one of a divider network, a connector, and bulk routing.

17. The memory module of claim 14, further comprising means for generating a voltage reference signal on the memory module.

18. The memory module of claim 17, wherein the means for generating comprises a voltage divider network, routing, and a voltage source.

19. The memory module claim 14, wherein the means for providing at least one of, address, and control signals between the upper row of memory integrated circuits and the first addressing register and between the lower row of memory integrated circuits and the second addressing register comprises bulk routing.

20. The memory module of claim 14, wherein the means for providing at least one of address and control signals to the first addressing register and the second addressing register comprises a connector, escape routing, and bulk routing.

21. A double high memory module, comprising:

a printed circuit board configured as a micro-ball grid array, the printed circuit board comprising:

a first row of memory integrated circuits;

a second row of memory integrated circuits;

a first addressing register and a second addressing register each having at least one of address and control input routing primarily provided in a first layer, the first addressing register coupled to the first row of memory integrated circuits and the second addressing register coupled to the second row of memory integrated circuits; and a first phase-locked loop and a second phase-locked loop, the first phase-locked loop coupled to the first row of memory integrated circuits and the first addressing register, the second phase-locked loop coupled to the second row of memory integrated circuits and the second addressing register.

* * * * *

UNITED STATES PATENT AND TRADEMARK OFFICE

CERTIFICATE OF CORRECTION

PATENT NO. : 7,212,424 B2
APPLICATION NO. : 11/085693
DATED : May 1, 2007
INVENTOR(S) : Brian M. Johnson et al.

It is certified that error appears in the above-identified patent and that said Letters Patent is hereby corrected as shown below:

In column 5, line 53, delete “10b” and insert -- 110b --, therefor.

In column 6, line 3, delete “110” and insert -- 1110 --, therefor.

In column 6, line 6, delete “GND/544 G” and insert -- GND\G --, therefor.

In column 8, line 30, in Claim 19, after “module” insert -- of --.

Signed and Sealed this

Nineteenth Day of August, 2008

JON W. DUDAS
*Director of the United States Patent and Trademark Office*